US007712888B2

(12) United States Patent
Lee et al.

(10) Patent No.: US 7,712,888 B2
(45) Date of Patent: May 11, 2010

(54) INKJET PRINTING SYSTEM FOR MANUFACTURING THIN FILM TRANSISTOR ARRAY

(75) Inventors: Yong-Uk Lee, Seongnam-si (KR); Mun-Pyo Hong, Seongnam-si (KR); Joon-Hak Oh, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 463 days.

(21) Appl. No.: 11/544,092

(22) Filed: Oct. 6, 2006

(65) Prior Publication Data

US 2007/0132825 A1 Jun. 14, 2007

(30) Foreign Application Priority Data

Dec. 14, 2005 (KR) ...................... 10-2005-0123136

(51) Int. Cl.

*B41J 29/38* (2006.01)
*B41J 2/195* (2006.01)
*B41J 2/01* (2006.01)
*H01L 35/24* (2006.01)
*H01L 51/40* (2006.01)

(52) U.S. Cl. ............................... 347/102; 347/6; 347/7; 347/17; 257/40; 438/99

(58) Field of Classification Search ................... 257/40; 427/335; 438/29, 99, 782
See application file for complete search history.

(56) References Cited

U.S. PATENT DOCUMENTS 6,808,749 B2 10/2004 Morii et al.
6,957,608 B1 * 10/2005 Hubert et al. ............... 101/483
2002/0100419 A1 * 8/2002 Nagashima ................. 118/722
2003/0099774 A1 5/2003 Morii et al.
2003/0103099 A1 6/2003 Gaston et al.
2005/0104945 A1 * 5/2005 Chung et al. ................ 347/101

FOREIGN PATENT DOCUMENTS

JP 06-112129 4/1994
JP 2002-252199 9/2002
JP 2004-087482 3/2004
JP 2004-088094 3/2004

(Continued)

OTHER PUBLICATIONS

English Language Abstract, KR Patent First Publication No. 2005-088686, Sep. 7, 2005, 1 page.

(Continued)

*Primary Examiner*—Matthew Luu
*Assistant Examiner*—Kendrick X Liu
(74) *Attorney, Agent, or Firm*—Innovations Counsel LLP

(57) ABSTRACT

An inkjet printing system according to an exemplary embodiment of the present invention includes an inkjet printing chamber depositing ink on a substrate, and a drying chamber spaced from inkjet printing chamber by a predetermined interval and drying the ink by regulating a vapor pressure of a solvent of the ink deposited on substrate. The drying chamber is provided separately, and the vapor pressure of the solvent within the drying chamber is regulated, so that the drying speed of the ink is regulated so as to improve the crystallinity of the organic semiconductor.

5 Claims, 15 Drawing Sheets

FOREIGN PATENT DOCUMENTS

| | | |
|---|---|---|
| JP | 2004-167304 | 6/2004 |
| JP | 2005-158954 | 6/2005 |
| JP | 2005-166958 | 6/2005 |
| KR | 2005-067014 | 6/2005 |
| KR | 2005-088686 | 9/2005 |

OTHER PUBLICATIONS

English Language Abstract, KR Patent First Publication No. 2005-067014, Jun. 30, 2005, 1 page.
English Language Abstract, JP Patent First Publication No. 2005-166958, Jun. 23, 2005, 1 page.
English Language Abstract, JP Patent First Publication No. 2005-158954, Jun. 16, 2005, 1 page.
English Language Abstract, JP Patent First Publication No. 2004-167304, Jun. 17, 2004, 1 page.
English Language Abstract, JP Patent First Publication No. 2004-088094, Mar. 18, 2004, 1 page.
English Language Abstract, JP Patent First Publication No. 2004-087482, Mar. 18, 2004, 1 page.
English Language Abstract, JP Patent First Publication No. 2002-252199, Sep. 6, 2002, 1 page.
English Language Abstract, JP Patent First Publication No. 06-112129, Apr. 22, 1994, 1 page.

* cited by examiner

INKJET PRINTING SYSTEM FOR MANUFACTURING THIN FILM TRANSISTOR ARRAY

CROSS-REFERENCE TO RELATED APPLICATION

This application claims priority to and the benefit of Korean Patent Application No. 10-2005-0123136 filed in the Korean Intellectual Property Office on Dec. 14, 2005, the contents of which are incorporated herein by reference.

FIELD OF THE INVENTION

The present invention relates to an inkjet printing system for manufacturing a thin film transistor array for a flat panel display.

DESCRIPTION OF THE RELATED ART

Generally, a flat panel display, such as a liquid crystal display (LCD), an organic light emitting diode (OLED) display, and an electrophoretic display, includes a plurality of pairs of field generating electrodes and an electro-optical activation layer disposed therebetween. The liquid crystal display includes a liquid crystal layer as the electro-optical activation layer, and the organic light emitting diode display includes an organic emission layer as the electro-optical activation layer.

One of the pair of field generating electrodes is generally connected to a switching element so as to receive an electrical signal which the electro-optical activation layer converts to an image.

In the flat panel display, a thin film transistor (TFT), which is a three terminal element, is used as the switching element. On the display panel a gate line transmits a scanning signal to control the turning on and off of the thin film transistor to connect the image signal from data line to the pixel electrode.

Because an organic thin film transistor, constructed mainly of a crystalline material that has enhanced crystallinity and molecular ordering, can be manufactured by a solution process at a low temperature, particularly by an inkjet printing method, its applicability to a wide area flat panel display is limited only by the deposition process employed. However, organic semiconductors formed by inkjet printing may have poor crystal growth resulting in inferior transistor characteristics.

SUMMARY OF THE INVENTION

The present invention provides an inkjet printing system that produces an organic semiconductor having improved the crystallinity. An exemplary embodiment of the present invention provides an inkjet printing system including an inkjet printing chamber depositing ink on a substrate, and a drying chamber spaced from inkjet printing chamber for drying the ink by regulating the vapor pressure of a solvent deposited on substrate.

The method for manufacturing a thin film transistor array panel according to an exemplary embodiment of the present invention includes forming an organic semiconductor by depositing a solvent containing ink on a substrate within an inkjet printing chamber, taking the substrate out of the inkjet printing chamber and then placing substrate in a drying chamber, and drying the organic semiconductor by regulating the vapor pressure of the ink solvent using a vapor pressure regulating device. Advantageously, the organic solvent may be one of mesitylen and tetralin.

BRIEF DESCRIPTION OF THE DRAWINGS

The forgoing and other objects and features of the present invention may become more apparent from a reading of the ensuing description together with the drawing, in which.

DETAILED DESCRIPTION OF THE EMBODIMENTS

Figure 1:
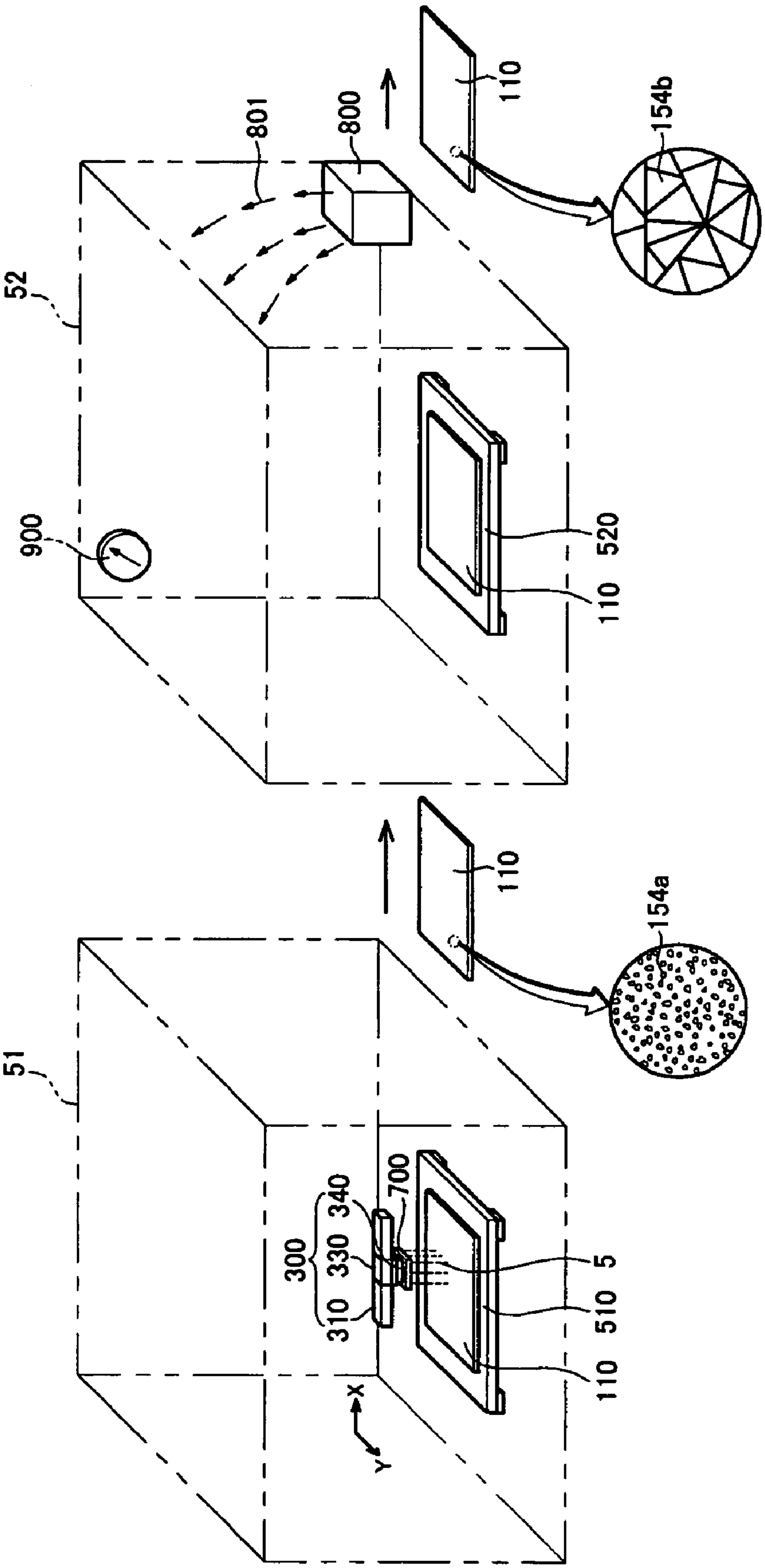
FIG. 1 is a perspective view of an inkjet printing system according to an exemplary embodiment of the present invention.

In the drawings, the thickness of layers, films, panels, regions, etc., are exaggerated for clarity. Like reference numerals designate like elements throughout the specification. It will be understood that when an element, such as a layer, film, region, or substrate, is referred to as being “on” another element, it can be directly on the other element or intervening elements may also be present. In contrast, when an element is referred to as being “directly on” another element, there are no intervening elements present.

An inkjet printing system according to an exemplary embodiment of the present invention will be explained in detail with reference to FIG. 1 to FIG. 3 hereinafter. FIG. 1 is a perspective view of an inkjet printing system according to an exemplary embodiment of the present invention, FIG. 2 is a bottom plan view of a head unit of inkjet printing system according to the exemplary embodiment of the present invention, and FIG. 3 is a drawing schematically showing a method for forming an organic semiconductor using inkjet head of inkjet printing system according to the exemplary embodiment of the present invention.

Figure 2:
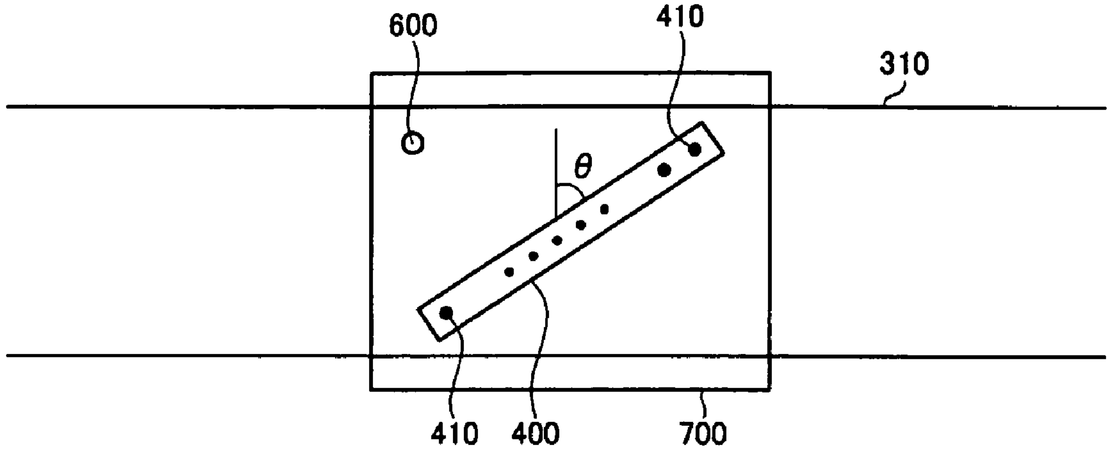
FIG. 2 is a bottom plan view of a head unit of an inkjet printing system according to an exemplary embodiment of the present invention.
Figure 3:
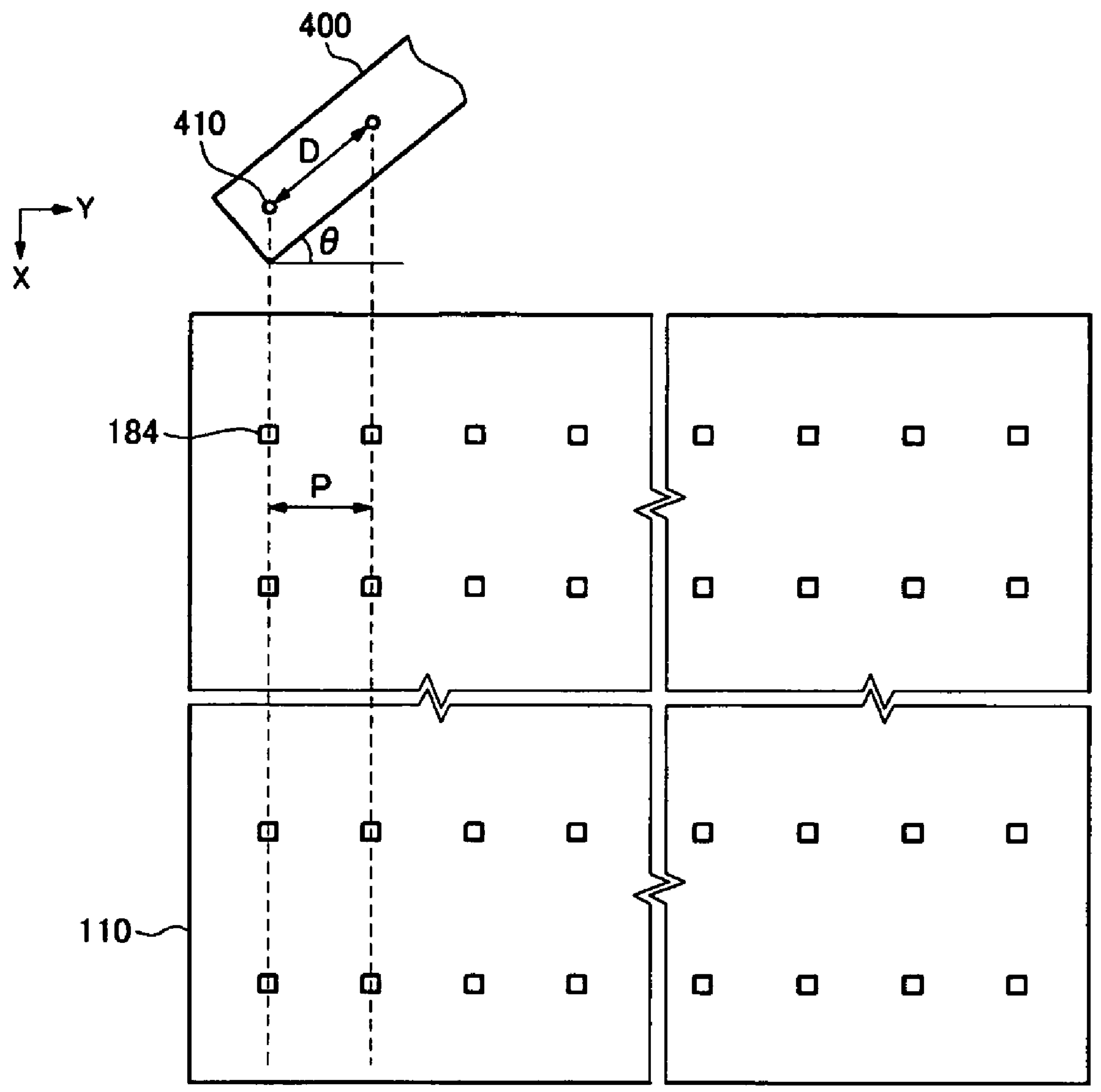
FIG. 3 is a drawing schematically showing a method for forming an organic semiconductor using an inkjet head of an inkjet printing system according to an exemplary embodiment of the present invention.

As shown in FIG. 1 to FIG. 3, an inkjet printing system includes an inkjet printing chamber 51 in which an inkjet printing process is performed and a drying chamber 52 spaced from inkjet printing chamber 51 that regulates the ink solvent's vapor pressure.

Within inkjet printing chamber 51 are installed a stage 510 to which substrate 110 is mounted, a head unit 700 positioned over stage 510 and a transfer device 300 for moving head unit 700.

Head unit 700 includes an inkjet head 400 and sensor 600 for positioning inkjet head 400. Inkjet head 400 has the shape of a long bar and includes a plurality of nozzles 410 disposed on a bottom surface thereof. Ink 5 for forming an organic semiconductor 154 is deposited on substrate 110 through the nozzles 410. The ink solvent may be mesitylen, tetralin, cyclohexanone, etc. In addition, other suitable ink solvents can be used.

Inkjet head 400 is slanted with respect to the Y direction by a predetermined angle θ. Nozzle pitch D is the distance between the nozzles 410 formed in inkjet head 400. The distance P is identified as the distance between the organic semiconductors 154, which will be printed. As distances D and P are different from each other, the distance P between the neighboring organic semiconductors 154 is accommodated by rotating inkjet head 400 through a predetermined angle θ. Although inkjet head unit 700 is shown as a unitary part, it may be constructed of a plurality of parts.

Transfer device 300 includes a Y direction transfer member 310 positioning head unit 700 above substrate 110 for moving head unit 700 in the Y direction, an X direction transfer member 330 moving head unit 700 in an X direction, and a lifter 340 for raising and lowering head unit 700.

Within drying chamber 52A, stage 520, vapor pressure regulating device 800, and a vapor pressure detector 900 are installed. Vapor pressure regulating device 800 heats the solvent for ink 5 to a vapor 801 and then sprays the vapor 801 into an inner space of the drying chamber 52. Inside drying chamber 52 vapor pressure detector 900 detects the vapor pressure of the solvent.

Operations for forming an organic semiconductor on substrate 110 using inkjet printing system having the above-mentioned structure will now be explained.

First, head unit 700 is positioned above the corresponding substrate 110 in inkjet printing chamber 51 by the operations of the X or Y direction transfer member 330 or 310 and the lifter 340.

Subsequently, by driving the X direction transfer member 330 of transfer device 300 and the nozzle 410 of inkjet head 400, the ink 5 is deposited while head unit 700 is moved in the X direction, thereby forming an organic semiconductor 154 on the respective pixels.

Subsequently, substrate 110 is taken out of inkjet printing chamber 51 and is then placed in the drying chamber 52. Before substrate 110 is placed in the drying chamber 52, the size of crystal 154*a* of the organic semiconductor 154 formed on substrate 110 is very small.

Subsequently, the drying speed of the ink 5 is regulated by regulating the vapor pressure of the solvent inside the drying chamber 52 using the vapor pressure regulating device 800 so that the crystallinity of the organic semiconductor 154 is improved. As the vapor pressure of the solvent increases, the crystal growth of the organic semiconductor 154 is expedited, so that the size of the crystal 154*b* increases thereby improving its crystallinity. It is preferable that the vapor pressure of the solvent is increased to a value at which the organic semiconductor 154 does not dissolve again. At this time, by checking the vapor pressure of the solvent inside the chamber 52 using the vapor pressure detector 900, the vapor pressure of the solvent is regulated so as not to be excessive.

As such, by providing the separate drying chamber 52, the crystallinity of the organic semiconductor 154 can be improved, and a plurality of substrates can be simultaneously treated.

A method for manufacturing an organic thin film transistor array panel using inkjet printing system shown in FIG. 1 to FIG. 3 will be explained in detail with reference to FIG. 4 to FIG. 15.

Figure 4:
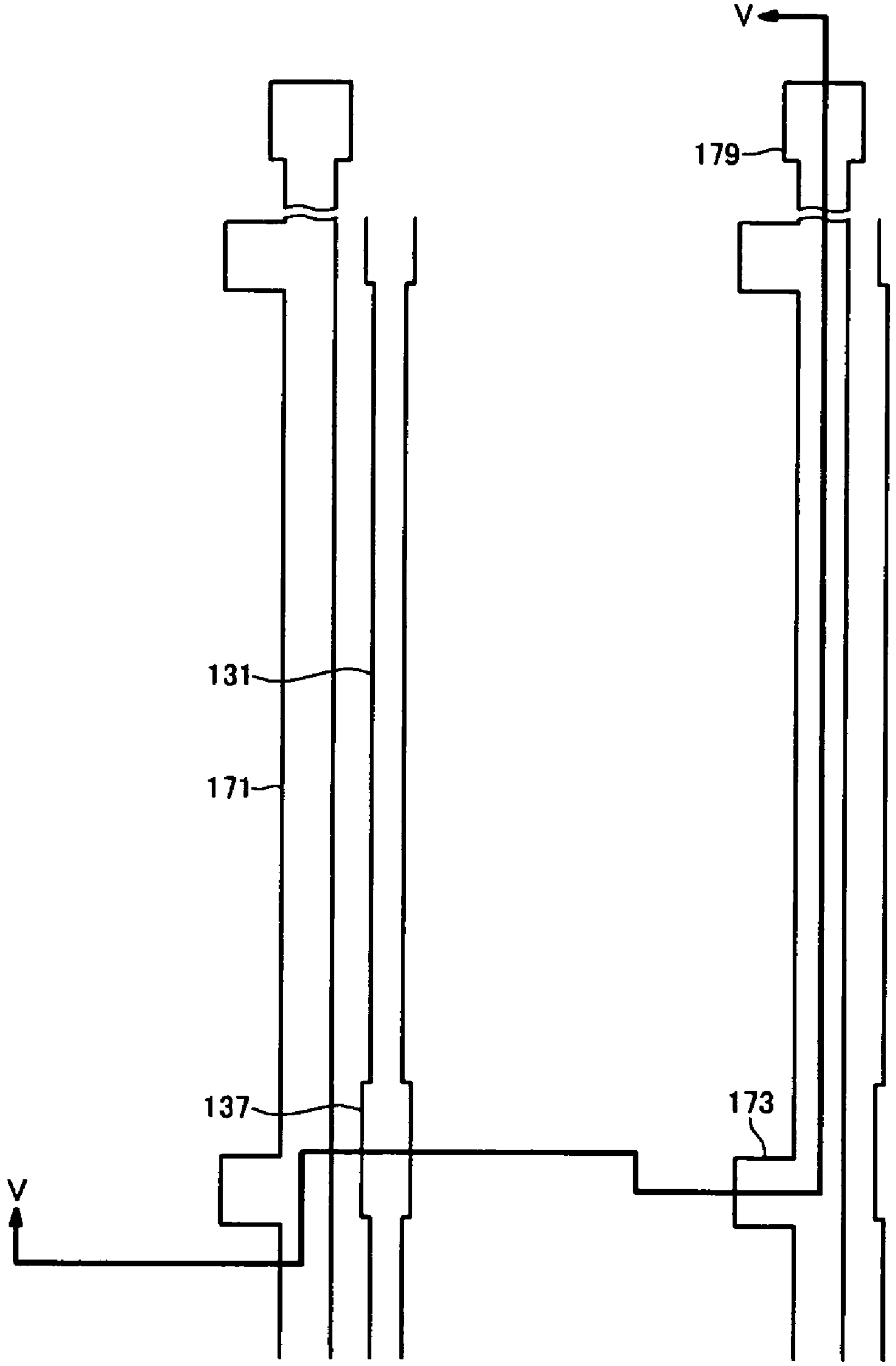
FIG. 4 is a layout view showing the first step of a method for manufacturing an organic thin film transistor array panel according to an exemplary embodiment of the present invention.
Figure 5:
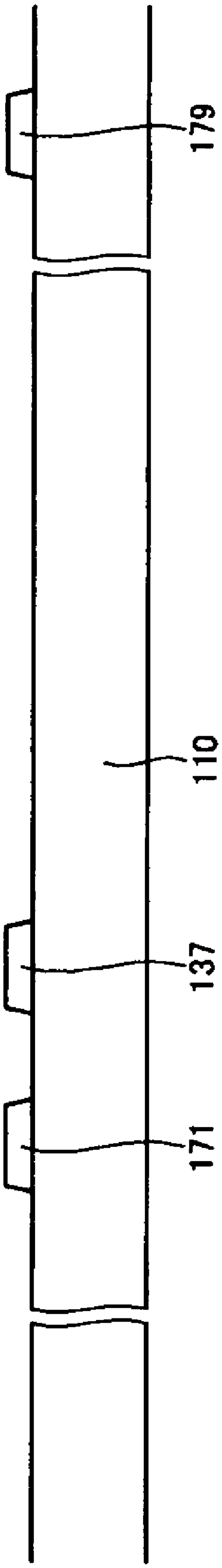
FIG. 5 is a cross-sectional view of the organic thin film transistor array panel taken along the line V-V of FIG. 4.
Figure 6:
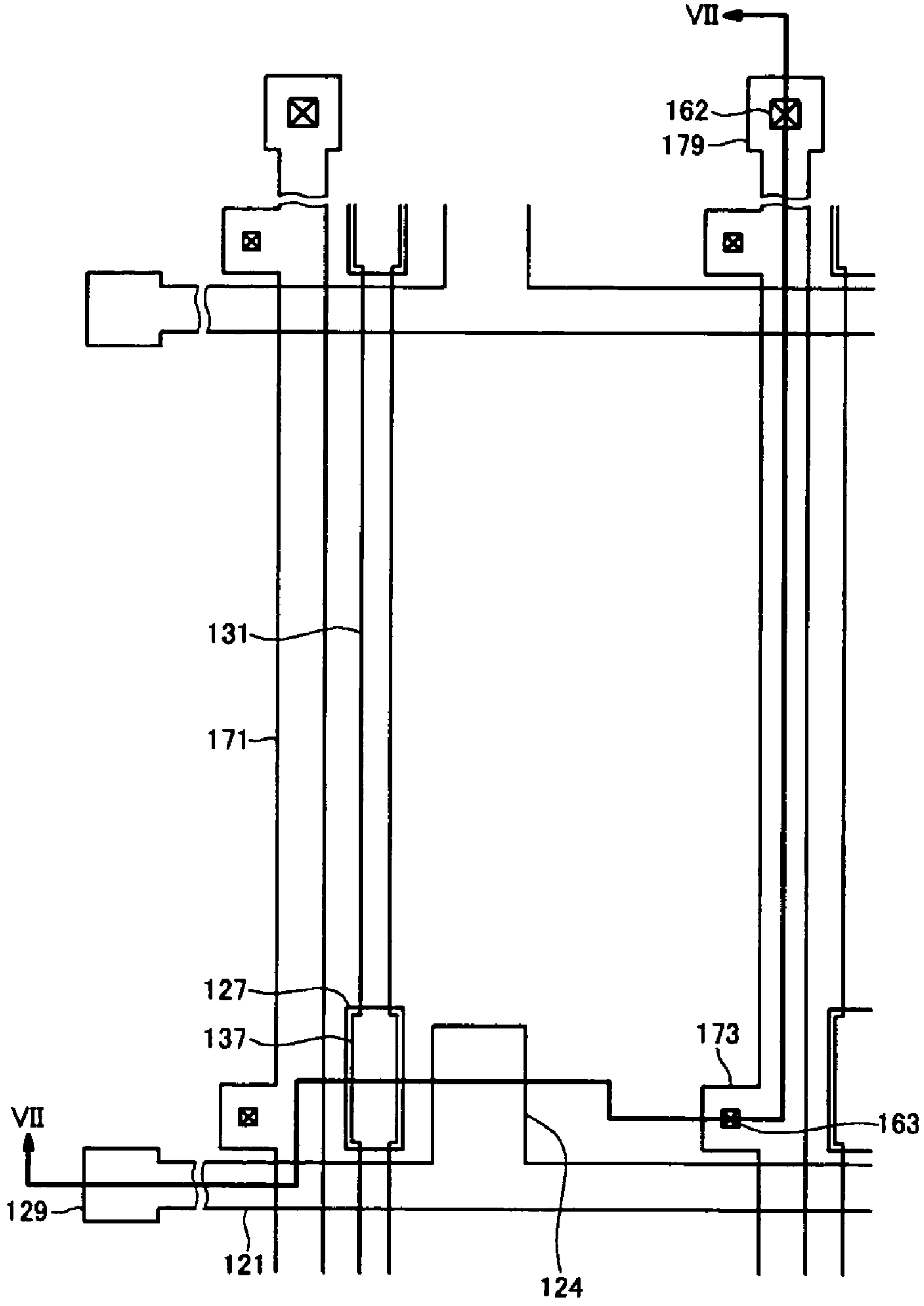
FIG. 6 is a layout view showing a subsequent step to that shown in FIG. 4.
Figure 7:
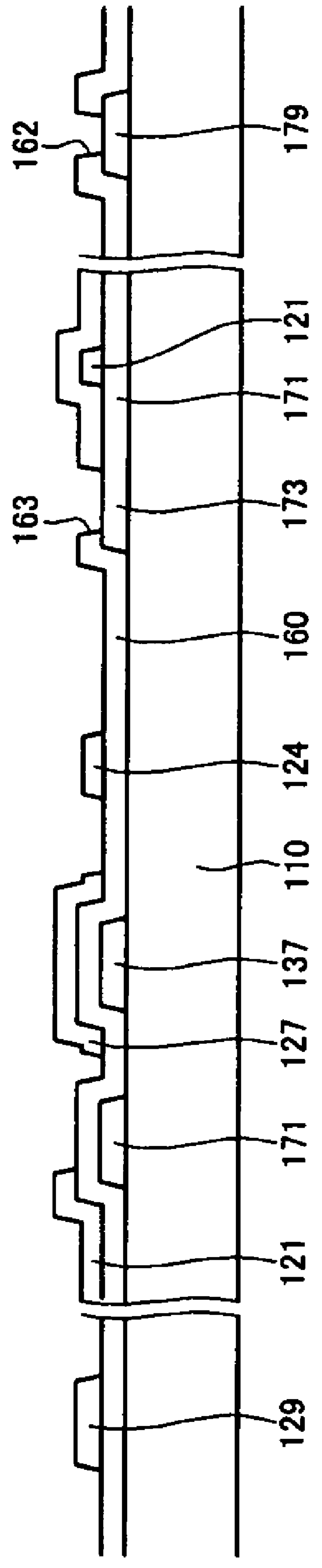
FIG. 7 is a cross-sectional view of the organic thin film transistor array panel taken along the line VII-VII of FIG. 6.
Figure 8:
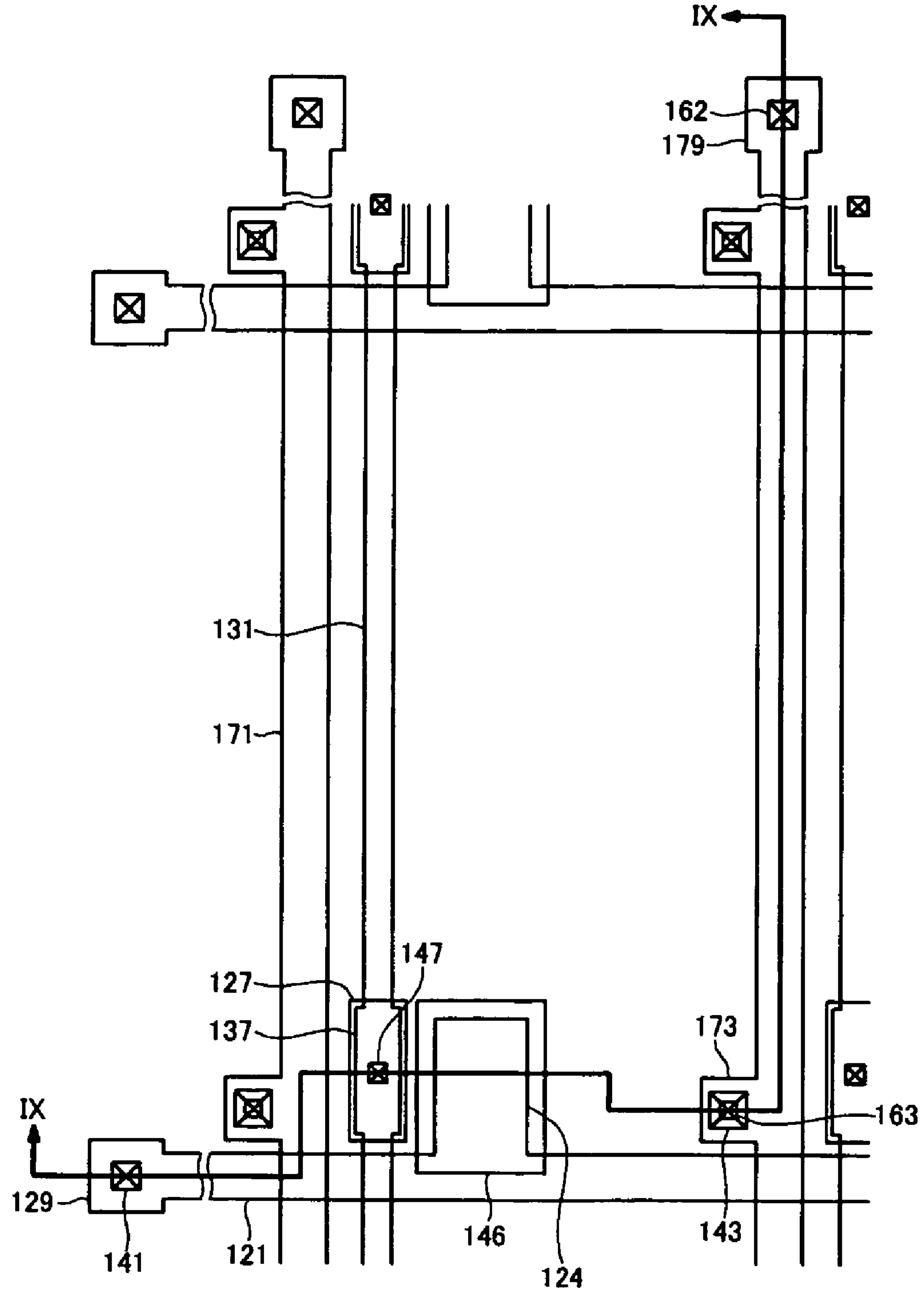
FIG. 8 is a layout view showing a subsequent step to that shown in FIG. 6.
Figure 9:
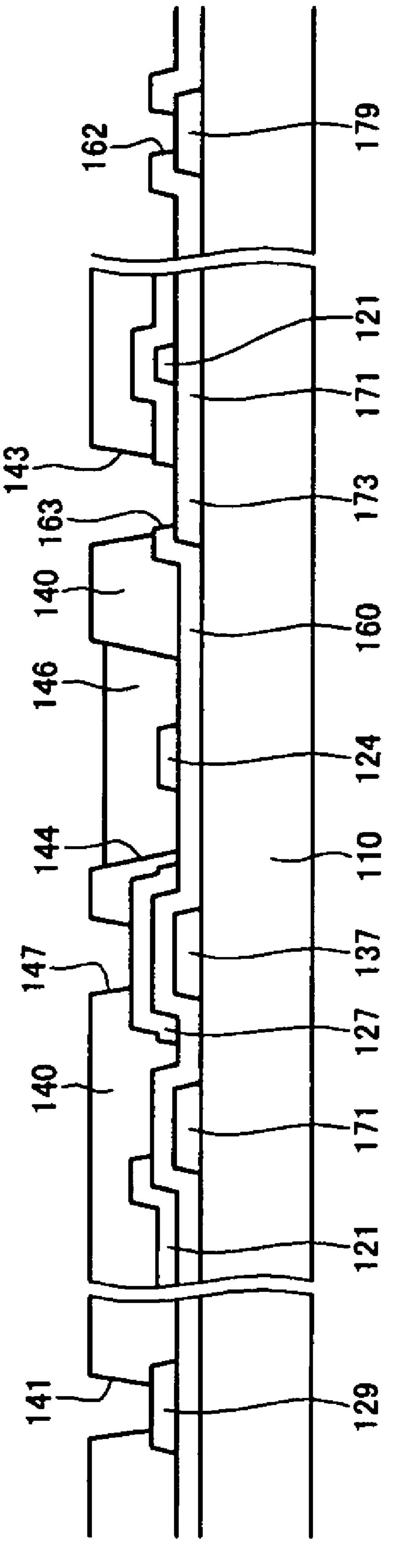
FIG. 9 is a cross-sectional view of the organic thin film transistor array panel taken along the line IX-IX of FIG. 8.
Figure 10:
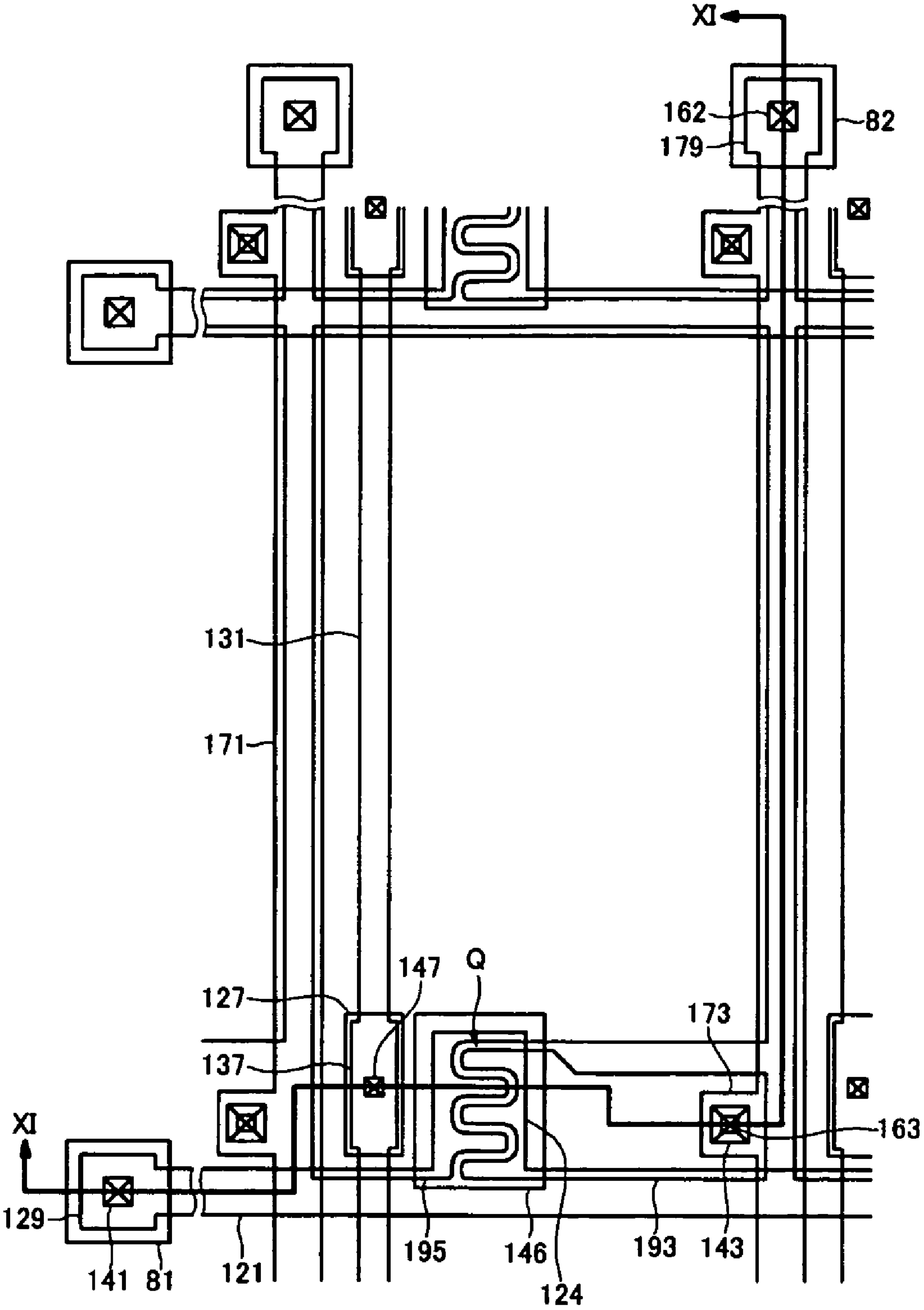
FIG. 10 is a layout view showing a subsequent step to that shown in FIG. 8.
Figure 11:
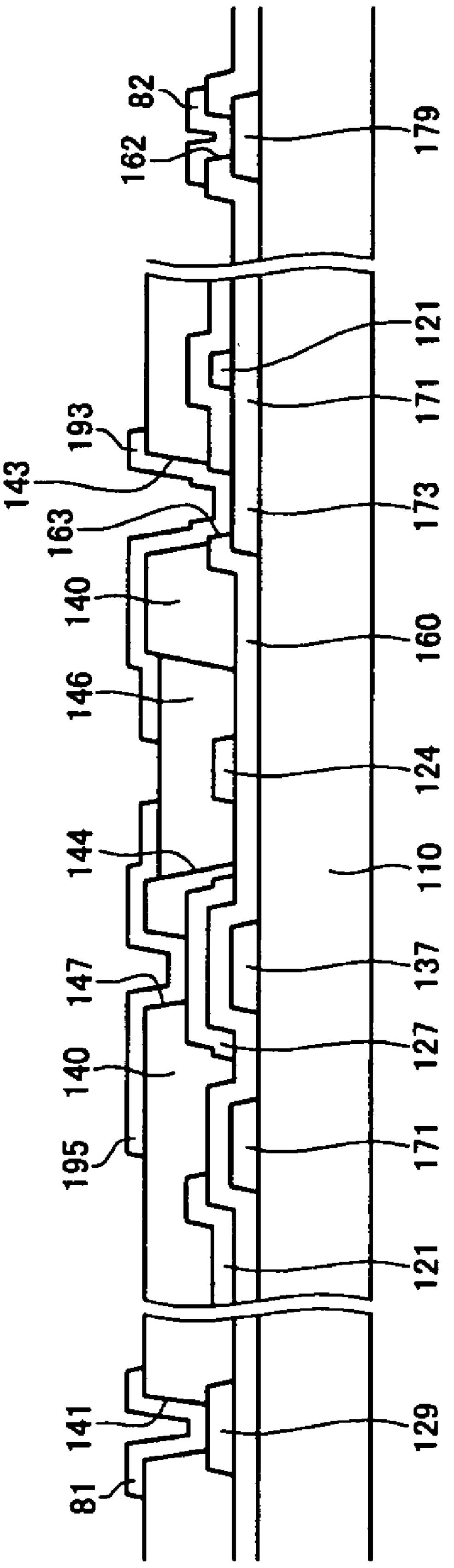
FIG. 11 is a cross-sectional view of the organic thin film transistor array panel taken along the line XI-XI of FIG. 10.
Figure 12:
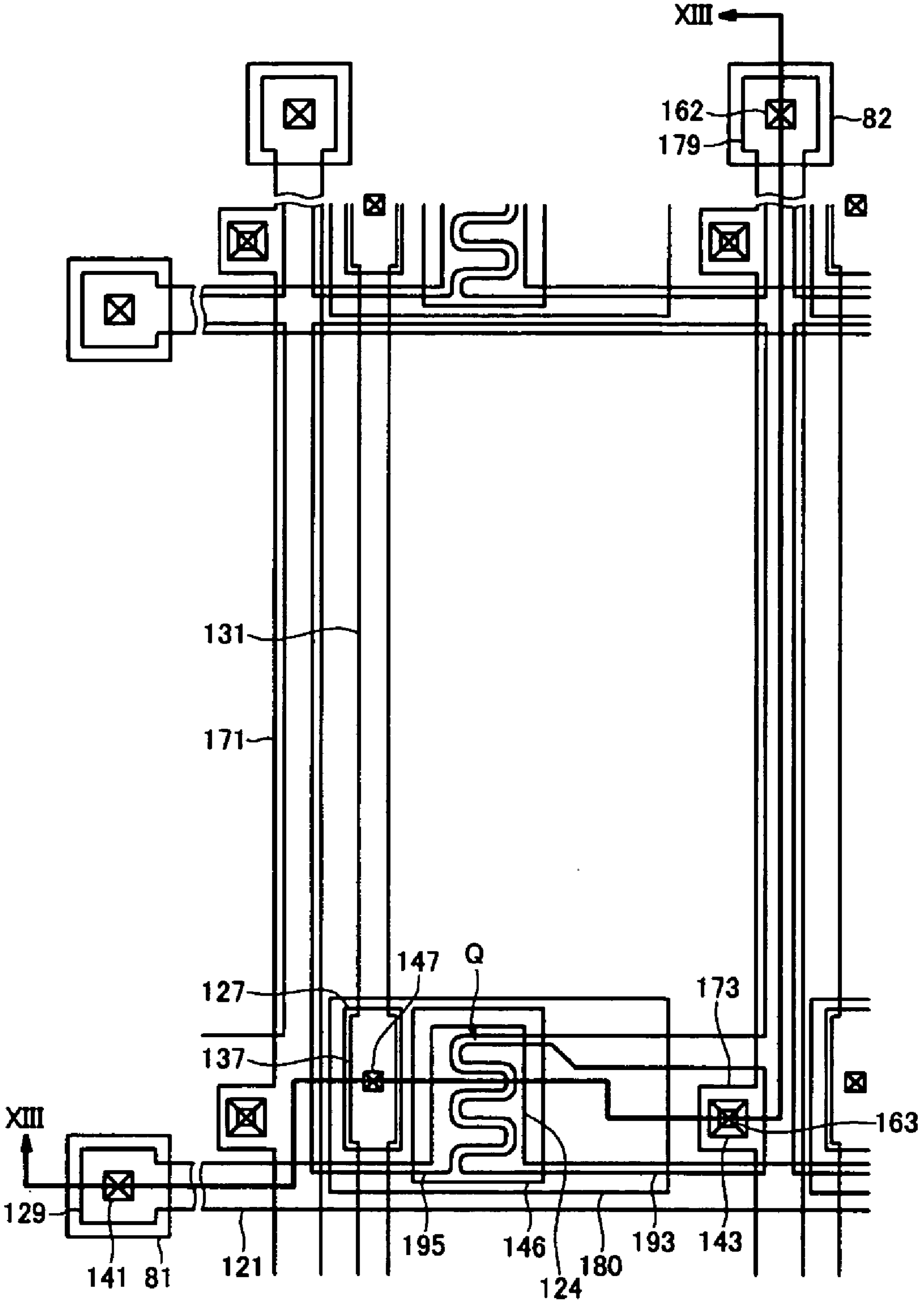
FIG. 12 is a layout view showing a subsequent step to that shown in FIG. 10.
Figure 13:
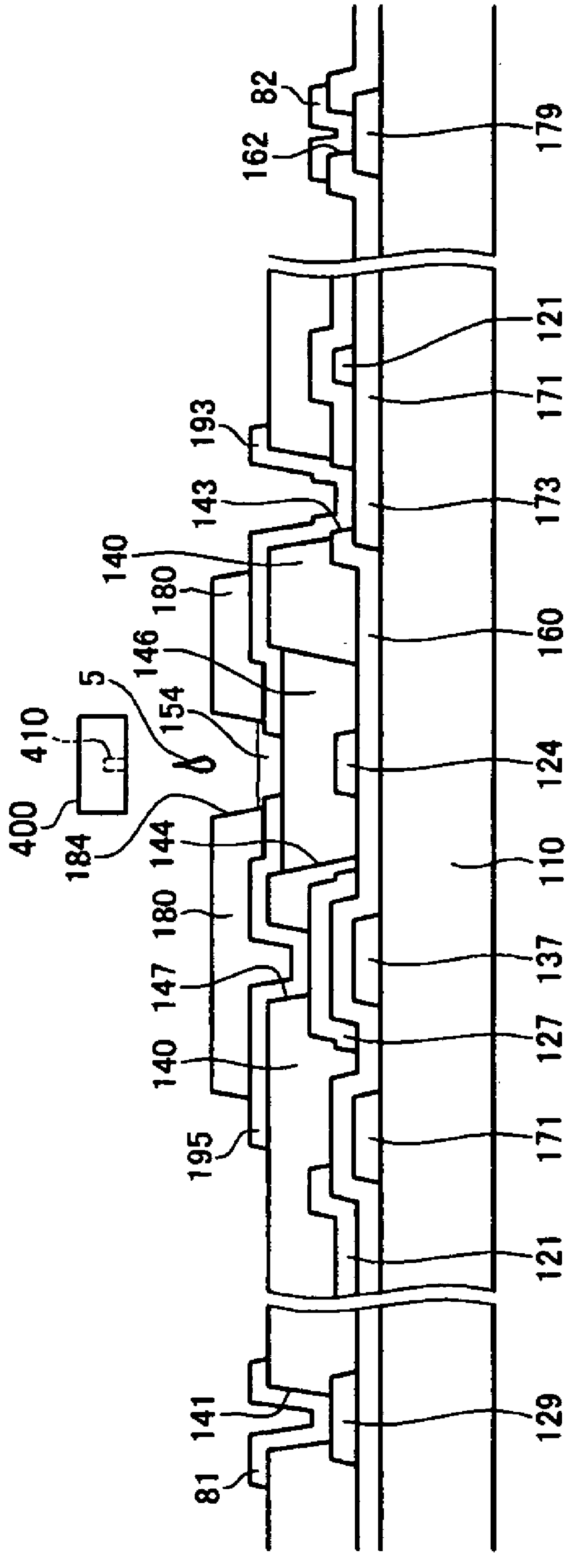
FIG. 13 is a cross-sectional view of the organic thin film transistor array panel taken along the line XIII-XIII of FIG. 12.
Figure 14:
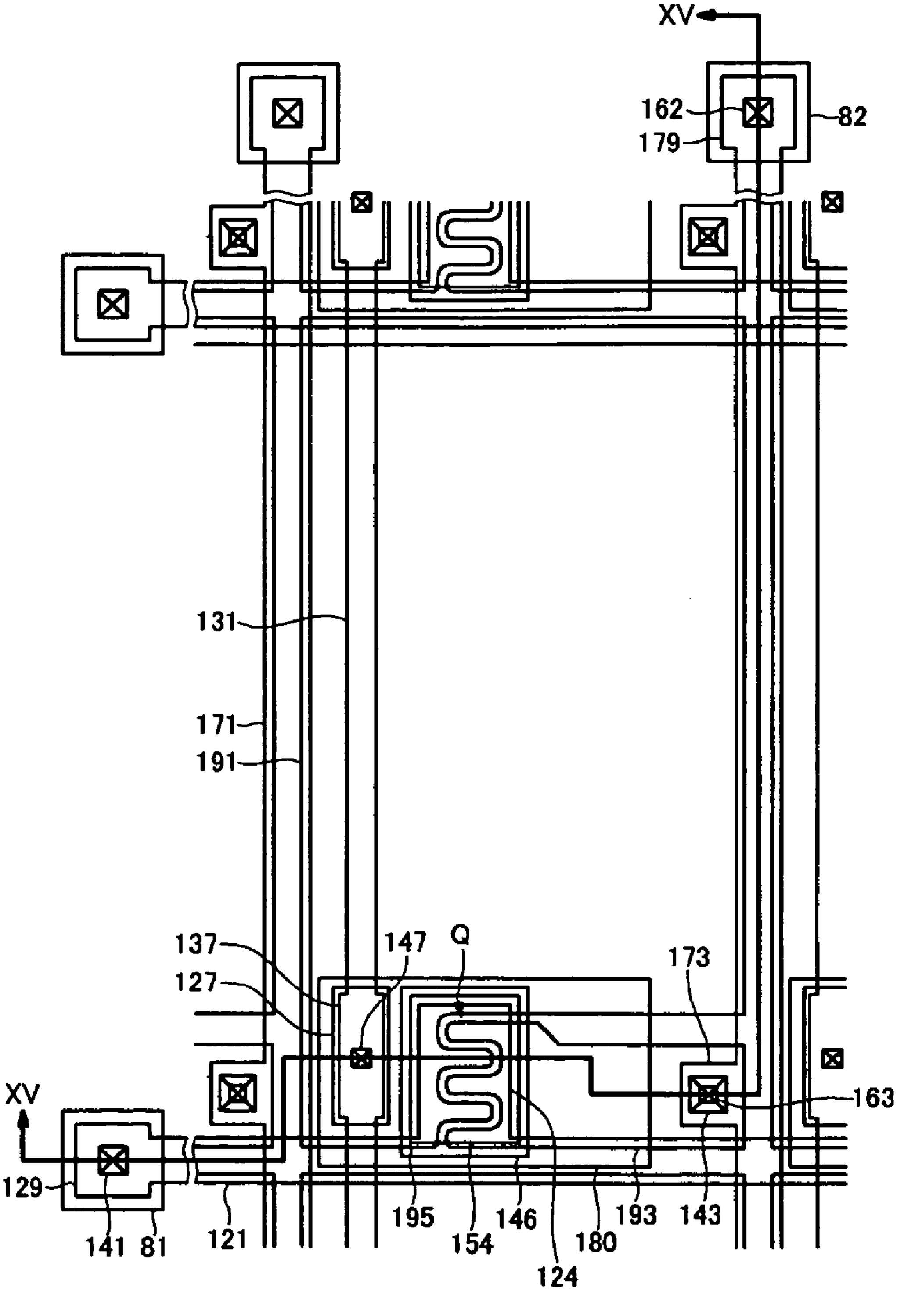
FIG. 14 is a layout view showing a subsequent step to that shown in FIG. 12.
Figure 15:
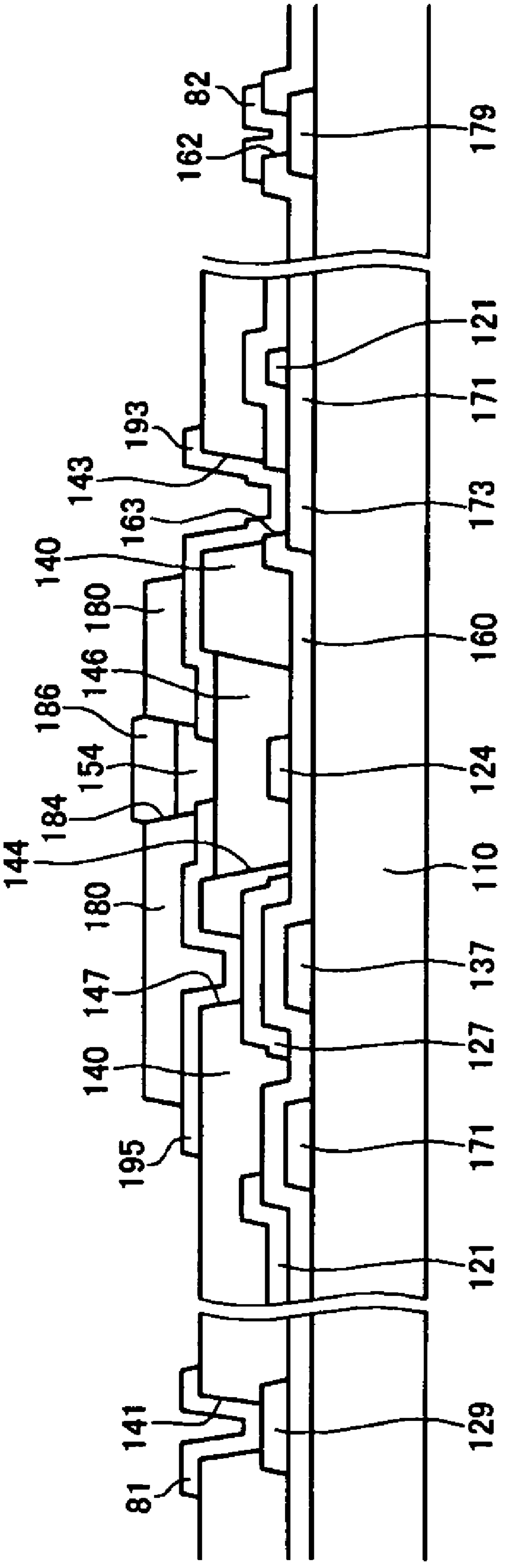
FIG. 15 is a cross-sectional view of the organic thin film transistor array panel taken along the line XV-XV of FIG. 14.

FIG. 4 is a layout view showing the first step of the method for manufacturing an organic thin film transistor array panel according to an exemplary embodiment of the present invention; FIG. 5 is a cross-sectional view of the organic thin film transistor array panel taken along the line V-V of FIG. 4; FIG. 6 is a layout view showing a subsequent step to that shown in FIG. 4; and FIG. 7 is a cross-sectional view of the organic thin film transistor array panel taken along the line VII-VII of FIG. 6. FIG. 8 is a layout view showing a subsequent step to that shown in FIG. 6, FIG. 9 is a cross-sectional view of the organic thin film transistor array panel taken along the line IX-IX of FIG. 8, FIG. 10 is a layout view showing a subsequent step to that shown in FIG. 8, and FIG. 11 is a cross-sectional view of the organic thin film transistor array panel taken along the line XI-XI of FIG. 10. FIG. 12 is a layout view showing a subsequent step to that shown in FIG. 10, FIG. 13 is a cross-sectional view of the organic thin film transistor array panel taken along the line XIII-XIII of FIG. 12, FIG. 14 is a layout view showing a subsequent step to that shown in FIG. 12, and FIG. 15 is a cross-sectional view of the organic thin film transistor array panel taken along the line XV-XV of FIG. 14.

First, by depositing a metal layer on substrate 110 by, for example, a sputtering method, and etching the same by photolithography, data lines 171, each including a plurality of protrusions 173 and an end portion 179, and storage electrode lines 131, each including a plurality of storage electrodes 137, as shown in FIG. 4 and FIG. 5 are formed.

Subsequently, a lower interlayer insulating layer 160 having contact holes 163 and 162 is formed by performing a chemical vapor deposition (CVD) with an inorganic material or a spin coating with an organic material. The contact holes 163 and 162 can be formed by photolithography using a photosensitive film in the case of an inorganic material or only by lithography in the case of an organic material.

Referring to FIG. 6 and FIG. 7, by depositing a metal layer on the lower interlayer insulating layer 160, and etching the same by photolithography, gate lines 121, each including a plurality of gate electrodes 124 and an end portion 129, and storage capacitor conductors 127 are formed.

Subsequently, referring to FIG. 8 and FIG. 9, by performing a spin coating with, for example, a photosensitive organic material, and patterning the same, an upper interlayer insulating layer 140, having upper side walls of an opening 144 and contact holes 141, 143, and 147, is formed. At this time, the end portions 179 of data lines 171 are formed such that all the organic material is removed.

Subsequently, a gate insulator 146 is formed in opening 144 of the upper interlayer insulating layer 140 by, for example, an inkjet printing method. To form gate insulator 146 by inkjet printing, a solution is deposited in opening 144 and is then dried. However, the present invention is not limited to this, and gate insulator 146 can be formed by various solution processes, such as a spin coating and a slit coating.

Referring to FIG. 10 and FIG. 11, by sputtering, for example, an amorphous ITO and then performing photolithography, pixel electrodes 191 including a drain electrode 195, source electrodes 193, and contact assistants 81 and 82 are formed. It is preferable that a temperature be a low temperature of 25° C. to 130° C., such as room temperature, and it is preferable that the amorphous ITO be etched using a weak basic etchant. By forming the ITO at a low temperature and etching the same with a weak basic etchant, gate insulator 146 and upper interlayer insulating layer 140, which are made of an organic material, can be prevented from being damaged by heat or the chemical solution.

Subsequently, as shown in FIG. 12 and FIG. 13, by depositing a photosensitive organic layer and developing the same, a bank 180 having an opening 184 is formed. Then, ink 5 from nozzle 410 of inkjet head 400 is deposited in opening 184 to form organic semiconductor 154.

Subsequently, substrate 110 is transferred to the drying chamber 52 where vapor pressure regulating device 800 controls the drying speed of the ink solvent's vapor pressure so as to improve the crystallinity of the deposited organic semiconductor 154.

Subsequently, as shown in FIG. 14 and FIG. 15, a light blocking member 186 is formed on the organic semiconductor 154 thereby completing the organic thin film transistor array panel.

An organic thin film transistor array panel manufactured by the manufacturing method of an organic thin film transistor array panel according to the above exemplary embodiment of the present invention will be explained in detail hereinafter.

A plurality of data lines 171 and a plurality of storage electrode lines 131 are formed on an insulation substrate 110 that is made of transparent glass, silicone, plastic, etc.

Data lines 171 transmit data signals and generally extend in a vertical direction. Each of data lines 171 includes a plurality of protrusions 173 protruding laterally and an end portion 179 that is enlarged to have a wide area for connection with another layer or an external driving circuit. A data driving circuit (not shown) generating data signals may be mounted on a flexible printed circuit film (not shown) attached on substrate 110, directly mounted on substrate 110, or integrated with substrate 110. In the case that data driving circuit is integrated with substrate 110, data lines 171 may extend so as to be directly connected to the same.

Storage electrode lines 131 receive a predetermined voltage and extend substantially in parallel with data lines 171. Each of storage electrode lines 131 is disposed between two data lines 171 and is closer to the left one of the two data lines 171. Storage electrode lines 131 include storage electrodes 137 extending laterally. However, the shape and the disposition of storage electrode lines 131 can be variously modified.

Data lines 171 and storage electrode lines 131 may be made of an aluminum-based metal such as aluminum Al or an aluminum alloy, a silver-based metal such as silver Ag or a silver alloy, a gold-based metal such as gold Au or a gold alloy, a copper-based metal such as copper Cu or a copper alloy, a molybdenum-based metal such as molybdenum Mo or a molybdenum alloy, chromium Cr, tantalum Ta, titanium Ti, etc. They can have a multilayer structure including two conductive layers (not shown) having different physical properties. One of the conductive layers is made of a metal with a low resistivity, for example, an aluminum-based metal, a silver-based metal, and a copper-based metal, so as to decrease a signal delay or a voltage drop. In contrast, the other conductive layer is made of a material having an excellent adhesive property to substrate or a material having excellent physical, chemical, and electrical contact characteristics with other materials, particularly with indium tin oxide (ITO) and indium zinc oxide (IZO), for example, a molybdenum-based metal, chromium, titanium, and tantalum. As examples of such a combination, there may be a chromium lower layer and an aluminum (alloy) upper layer or an aluminum (alloy) lower layer and a molybdenum (alloy) upper layer. However, data lines 171 and storage electrode lines 131 can be made of various metals or conductors.

It is preferable that the sides of data lines 171 and storage electrode lines 131 are slanted by 30 to 80 degrees with respect to the surface of substrate 110.

On data lines 171 and storage electrode lines 131, a lower interlayer insulating layer 160 is formed. The lower interlayer insulating layer 160 can be made of an inorganic insulator or an organic insulator. As an example of the inorganic insulator, silicon nitride SiNx or silicon oxide SiO2 may be used. A thickness of the lower interlayer insulating layer 160 may be about 2,000 Å to 4 μm.

Lower interlayer insulating layer 160 may have a plurality of contact holes 163 and 162 respectively exposing the protrusions 173 and the end portions 179 of data lines 171.

On the lower interlayer insulating layer 160, a plurality of gate lines 121 and a plurality of storage capacitor conductors 127 are formed.

Gate lines 121 transmit a gate signal and generally extend in a horizontal direction so as to cross data lines 171 and storage electrode lines 131. Each of gate lines 121 includes a plurality of gate electrodes 124 upwardly protruding and an end portion 129 that is enlarged so as to have a wide area for connection to another layer or an external driving circuit. A gate driving circuit (not shown) generating gate signals may be mounted on a flexible printed circuit film (not shown) attached to substrate 110, directly mounted on substrate 110, or integrated with substrate 110. In the case that gate driving circuit is integrated with substrate 110, gate lines 121 may extend to be directly connected to gate driving circuit.

Storage capacitor conductors 127 are separated from gate lines 121 and overlap storage electrodes 137.

Gate lines 121 and storage capacitor conductors 127 can be made of the same material as data lines 171 and storage electrode lines 131. The sides of gate lines 121 and storage capacitor conductors 127 are slanted with respect to the surface of substrate 110, and the slanted angle may preferably be between about 30° to about 80°.

An upper interlayer insulating layer 140 is formed on gate lines 121 and storage capacitor conductors 127. The upper interlayer insulating layer 140 is made of an organic material or an inorganic material having a relatively low dielectric constant of about 2.5 to 4.0. As examples of an organic material, a polyacryl-based compound, a polystyrene-based compound, and a soluble high molecular compound such as benzocyclobutene (BCB) may be used, and as examples of an inorganic material, silicon nitride and silicon oxide may be used. A thickness of the upper interlayer insulating layer 140 may be about 5,000 Å to 4 μm.

By using an upper interlayer insulating layer 140 having a low dielectric constant, parasitic capacitance between data lines 171 and gate lines 121 and the upper conductive layer is reduced.

Upper interlayer insulating layer 140 is not present near end portions 179 of data lines 171. The reason for this is not only to prevent too much separation between lower interlayer insulating layer 160 and interlayer insulating layer 140 formed on the end portions 179 of data lines 171, but also to decrease the thickness of the interlayer insulating layer such that the end portions 179 of data lines 171 and the external circuit can be effectively connected to each other.

A plurality of openings 144 exposing gate electrodes 124, a plurality of contact holes 141 exposing the end portions 129 of gate lines 121, a plurality of contact holes 143 exposing the protrusions 173 of data lines 171, and a plurality of contact holes 147 exposing storage capacitor conductors 127 are formed in the upper interlayer insulating layer 140.

Gate insulators 146 are formed within openings 144 of upper interlayer insulating layer 140. Gate insulators 146 cover gate electrodes 124, and the thickness thereof is about 1,000 to 10,000 Å. The side walls of the openings 144 are higher than gate insulators 146 so that the upper interlayer insulating layer 140 serves as a bank, and the openings 144 have sufficient size as the surface of gate insulator 146 becomes planar.

Gate insulators 146 are made of an organic material or an inorganic material having a relatively high dielectric constant of about 3.5 to 10. As examples of an organic material, a soluble high molecular compound such as a polyimide-based compound, a polyvinyl alcohol-based compound, a polyfluorane-based compound, and parylene may be used, and as an example of an inorganic material, silicon oxide surface-treated by octadecyl trichloro silane (OTS) may be used. Particularly, it is preferable that the dielectric constant of gate insulators 146 is higher than that of the upper interlayer insulating layer 140.

By disposing gate insulators 146 with a high dielectric constant, the threshold voltage of the organic thin film transistor can be decreased and the amount of ion current thereof can be increased, thereby enhancing the efficiency of the organic thin film transistor.

A plurality of source electrodes 193, a plurality of pixel electrodes 191, and a plurality of contact assistants 81 and 82 may be formed on the upper interlayer insulating layer 140 and gate insulator 146. They can be made of a transparent conductive material such as IZO and ITO, and a thickness thereof may be about 300 Å to about 800 Å.

Source electrodes 193 are connected to data lines 171 through contact holes 143 and extend over gate electrodes 124.

Pixel electrodes 191 includes portions 195 (hereinafter referred to as drain electrodes) facing the source electrodes 193 centering on gate electrodes 124, and are connected to storage capacitor conductors 127 through the contact holes 147. Respective facing sides of the drain electrodes 195 and the source electrodes 193 are parallel with each other and snake windingly. The pixel electrodes 191 overlap gate lines 121 and data lines 171 so as to enhance an aperture ratio.

Contact assistants 81 and 82 are respectively connected to the end portions 129 of gate lines 121 and the end portions of data lines 171 through the contact holes 141 and 162. The contact assistants 81 and 82 complement the adhesive property of the end portions 129 of gate lines 121 and the end portions 179 of data lines 171 to an external device, and also protect these members.

A plurality of banks 180 are formed on the source electrodes 193, the pixel electrodes 191, and the upper interlayer insulating layer 140.

A plurality of openings 184 are formed in the banks 180. The openings 184 are positioned on gate electrodes 124 and the openings 144 of the upper interlayer insulating layer 140, and expose portions of the source electrodes 193 and the drain electrodes 195 and gate insulators 146 therebetween.

Banks 180 are made of a photosensitive organic material having a thickness of about 5,000 Å to 4 μm to which a solution process may be applied. Openings 184 of banks 180 are smaller than the openings 144 of the upper interlayer insulating layer 140. Accordingly, the banks 180 firmly fix gate insulators 146 formed below so that lifting of gate insulators 146 can be prevented and permeation of a chemical solution in the subsequent process can be reduced.

A plurality of organic semiconductor islands 154 are formed within openings 184 of banks 180. Organic semiconductors 154 contact source electrodes 193 and drain electrodes 195 above gate electrodes 124, and the height thereof is lower than that of the banks 180 so that the organic semiconductors 154 are completely surrounded by the banks 180. Since the organic semiconductors 154 are completely surrounded by banks 180 so that sides thereof are not exposed, permeation of a chemical solution into the sides of the semiconductors 154 in the subsequent process can be prevented.

Organic semiconductors 154 may include a high molecular compound or a low molecular compound that is dissolved in an organic solvent, and can be formed by an inkjet printing method.

Organic semiconductors 154 may include a derivative having a substituent of tetracene or pentacene. Organic semiconductors 154 may include oligothiophene having four to eight thiophene connected to positions 2 or 5 of the thiophene ring.

Organic semiconductors 154 may include polythienylenevinylene, poly 3-hexylthiophene, polythiophene, phthalocyanine, metalized phthalocyanine, or halogenated derivatives thereof. The organic semiconductors 154 may include perylenetetracarboxylic dianhydride (PTCDA), naphthalenetetracarboxylic dianhydride (NTCDA), or imide derivatives thereof. The organic semiconductor 154 may include perylene or coronene and derivatives including substituents thereof. The thickness of organic semiconductor may be about 300 Å to 3,000 Å.

One gate electrode 124, one source electrode 193, and one drain electrode 195 form one thin film transistor (TFT) Q together with one organic semiconductor 154. The channel of thin film transistor Q is formed on the organic semiconductor 154 between source electrode 193 and drain electrode 195.

The thin film transistors Q apply a data voltage to pixel electrodes 191 so as to generate an electric field together with the common voltage applied to the common electrode (not shown) of the display panel (not shown), thereby determining the the direction of liquid crystal molecules of the liquid crystal layer (not shown) between the two electrodes. Pixel electrodes 191 and the common electrode form a capacitor (hereinafter referred to as a liquid crystal capacitor) thereby maintaining the applied voltage after the thin film transistor is turned off.

Light blocking members 186 are formed on the organic semiconductors 154. The blocking members 186 are made of a fluorine-based hydrocarbon compound, a polyvinyl alcohol-based compound, etc., and protect the organic semiconductors 154 from outer heat, plasma, and chemical substances.

A passivation layer (not shown) for enhancing the protection of the organic semiconductors 154 may be formed on the blocking members 186.

In inkjet printing system and the manufacturing method of an organic thin film transistor array panel according to an embodiment of the present invention, the drying chamber is separately provided, and the vapor pressure of a solvent within the drying chamber is regulated so that the drying speed of the ink is regulated so as to improve the crystallinity of the organic semiconductor.

While this invention has been described in connection with what is presently considered to be practical exemplary embodiments, it is to be understood that the invention is not limited to the disclosed embodiments, but, on the contrary, is intended to cover various modifications and equivalent arrangements that will be apparent to those skilled in the art without, however, departing from the spirit and scope of the invention.

What is claimed is:

1. An inkjet printing system, comprising:

an inkjet printing chamber depositing ink on a substrate; and a drying chamber spaced from the inkjet printing chamber by a predetermined interval and drying the ink by regulating a vapor pressure of a solvent of the ink, wherein a vapor pressure regulating device regulates the vapor pressure of the solvent of the ink is installed in the drying chamber, and the vapor pressure regulating device sprays the solvent of the ink into the drying chamber to regulate the vapor pressure of the solvent of the ink.

2. Inkjet printing system of claim 1, wherein a vapor pressure detector detects the vapor pressure within the drying chamber is further installed in the drying chamber.

3. Inkjet printing system of claim 2, wherein a stage to which substrate is mounted, an inkjet head depositing the ink on substrate, and a transfer device moving inkjet head to a predetermined position are installed in inkjet printing chamber.

4. Inkjet printing system of claim 1, wherein the solvent is an organic solvent.

5. Inkjet printing system of claim 4, wherein the organic solvent is one of mesitylen and tetralin.

* * * * *